US012392249B2

United States Patent
Kohlhauser et al.

(10) Patent No.: US 12,392,249 B2
(45) Date of Patent: Aug. 19, 2025

(54) COATING FOR THERMALLY AND ABRASIVELY LOADED TURBINE BLADES

(71) Applicant: Oerlikon Surface Solutions AG, Pfäffikon, Pfäffikon (CH)

(72) Inventors: Bernhard Kohlhauser, Vienna (AT); Jürgen Ramm, Maienfeld (CH); Oliver Hunold, Wädenswil (CH); Edgar Balter, Übersaxen (AT)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 18/257,419

(22) PCT Filed: Oct. 27, 2021

(86) PCT No.: PCT/EP2021/000134
§ 371 (c)(1),
(2) Date: Jun. 14, 2023

(87) PCT Pub. No.: WO2022/128144
PCT Pub. Date: Jun. 23, 2022

(65) Prior Publication Data
US 2024/0026793 A1 Jan. 25, 2024

(30) Foreign Application Priority Data
Dec. 15, 2020 (DE) .................. 10 2020 007 662.9

(51) Int. Cl.
*F01D 5/28* (2006.01)
*C23C 28/00* (2006.01)

(52) U.S. Cl.
CPC .......... *F01D 5/288* (2013.01); *C23C 28/3215* (2013.01); *C23C 28/34* (2013.01);
(Continued)

(58) Field of Classification Search
CPC ............................ C23C 28/345; F01D 5/288
See application file for complete search history.

(56) References Cited

U.S. PATENT DOCUMENTS

| | | | | |
|---|---|---|---|---|
| 4,328,285 A | * | 5/1982 | Siemers | ..................... C23C 4/02 |
| | | | | 427/454 |
| 5,935,407 A | * | 8/1999 | Nenov | ................... C23C 28/022 |
| | | | | 205/228 |
| 6,382,920 B1 | * | 5/2002 | Dopper | ..................... C23C 4/11 |
| | | | | 416/241 B |

(Continued)

FOREIGN PATENT DOCUMENTS

| | | |
|---|---|---|
| CN | 108431290 A | 8/2018 |
| JP | 2002053946 A | 2/2002 |

(Continued)

OTHER PUBLICATIONS

International Search Report issued in Application No. PCT/EP2021/000134 dated Feb. 7, 2022.
(Continued)

*Primary Examiner* — Cachet I Proctor
(74) *Attorney, Agent, or Firm* — Chrisman Gallo Tochtrop LLC

(57) ABSTRACT

A method for coating a substrate surrounding a gas turbine blade, including the following steps: in a first step, a MCrAlY matrix is applied by means of a PVD method; in a further step, an oxide layer is applied by means of a PVD method.

6 Claims, 4 Drawing Sheets

(52) U.S. Cl.
CPC .... *F05D 2230/313* (2013.01); *F05D 2230/90* (2013.01); *F05D 2300/175* (2013.01); *F05D 2300/611* (2013.01)

(56) References Cited

U.S. PATENT DOCUMENTS

| | | | | |
|---|---|---|---|---|
| 6,394,755 | B1* | 5/2002 | Stowell | F01D 5/288 416/241 B |
| 11,655,544 | B2* | 5/2023 | Ramm | C23C 14/081 428/216 |
| 2002/0172837 | A1* | 11/2002 | Allen | C23C 28/3215 427/446 |
| 2013/0122317 | A1* | 5/2013 | Cheruvu | C22C 19/03 204/192.12 |
| 2018/0195176 | A1* | 7/2018 | Annen | C23C 28/3455 |
| 2018/0340445 | A1* | 11/2018 | Opalka | F01D 25/005 |
| 2020/0048738 | A1* | 2/2020 | Polcik | B32B 15/00 |
| 2020/0392629 | A1* | 12/2020 | Ramm | C23C 28/40 |

FOREIGN PATENT DOCUMENTS

| | | |
|---|---|---|
| JP | 2011125943 A | 6/2011 |
| WO | 2017005460 A1 | 1/2017 |
| WO | WO-2019206979 A1 * 10/2019 | ........... C23C 14/024 |

OTHER PUBLICATIONS

Written Opinion issued in Application No. PCT/EP2021/000134 dated Feb. 7, 2022.

* cited by examiner

COATING FOR THERMALLY AND ABRASIVELY LOADED TURBINE BLADES

Gas turbines have the task of moving a gas in one direction. The gas turbine comprises at least one rotor which rotates about an axis and which has a carrier on whose periphery a plurality of turbine blades projecting outwards radially are arranged. In order to prevent as much as possible the gas from flowing back in the opposite direction to the desired one, and thus to achieve the highest possible efficiency of gas turbines, a turbine liner is provided to ensure a gap with a minimal gap spacing between the turbine blade and the turbine liner.

This is achieved by so-called run-in layers on the turbine liner side. These run-in layers serve to keep the gap spacing between a turbine blade and the surrounding turbine liner as small as possible in order to prevent pressure losses. The run-in layers are generally porous and only weakly bonded internally. The consequence of this is that the turbine blade tip, which at the beginning still frequently touches the run-in layer, wears it away until essentially contact-free concentricity is achieved with a minimal gap spacing.

However, the turbine blades, for example during their thermal expansion or vibration-induced deflection of the turbine from the center, can erode the porous and only weakly internally bonded run-in layer in an undesired manner and thus increase the gap spacing and reduce efficiency.

Blade tip coatings are used to protect the blade tip from wear. These blade tip coatings typically consist of abrasive particles (such as cubic boron nitride) embedded in a matrix (such as for example MCrAlY). "M" stands for a metal, which is usually cobalt, nickel or a cobalt-nickel alloy. "Cr" stands for chromium, "Al" for aluminum and "Y" stands for yttrium.

According to the prior art, such coatings are applied by complex and cost-intensive processes such as electrolytic or electrophoretic deposition (U.S. Pat. No. 5,935,407A).

A disadvantage of the coatings produced in this way according to the prior art is the poor adhesion of the coatings. In the corresponding coating process, the energy input is relatively low and there are hardly any diffusion processes at the interface to the substrate surface, which normally ensure acceptable layer adhesion. As a result, failure and delamination of the entire coating or of the abrasive particles can already occur due to the forces occurring during rotation.

In addition, both the abrasive particles used in the prior art and the matrix are not resistant to oxidation at high temperatures and fail due to oxidation. The abrasive particles typically used have a particle size in the order of magnitude of the layer thickness and can therefore reach from the surface to the interface between the coating and the substrate. If the particle is now oxidized, the blade material or the corresponding interface is directly attacked, which can lead to a direct attack of the blade material or of the interface between the blade material and the coating if the particle is oxidized.

There is therefore a need to make the coating known from the prior art more adhesive and more resistant to oxidation. The object of the present invention is based on this need.

The object described above is achieved according to the invention and in accordance with claim 1 in that depositions from the gas phase by means of PVD processes are used for the coating. The use of reactive spark vaporization is particularly preferred.

The adhesion of blade tip coatings can be significantly improved through the use of reactive spark evaporation, since a higher energy input from the gas ions contributes to improved coating adhesion. Also the manufacturing parameters can be chosen more freely, which means that deposition at higher temperatures is possible.

By using different target materials and reactive gases, a bonding layer and/or matrix as well as abrasive phases such as oxides, borides, carbides or nitrides can be deposited in a single process. These phases can either be introduced as layers in a multilayer structure or as macroparticles in a matrix. In contrast to conventional manufacturing processes for blade tip coatings which are based on electrolytic or electrophoretic deposition, very small particles or thin layers can be completely embedded in a matrix (e.g. comprising a MCrAlY material and preferably consisting of a MCrAlY material), whereby deeper-lying abrasive phases, even if they are not resistant to oxidation (which only applies to some), are protected from the overlying matrix (e.g. MCrALY). It is thus possible to achieve a protective effect of the blade tip against the run-in layer on the liner even in the event of contact or abrasion situations after a longer service life than with conventional blade tip coatings.

The coating can consist of several layers, whereby an adhesive layer can be adapted to the substrate material in order to enable optimal adhesion.

The abrasive phase of the blade tip coating can be matched to the run-in layering on the turbine liner. These abrasive phases can be built into the coating either as layers or as particles.

Layer thicknesses can be varied in order to adapt the coating to the thermal and abrasive stress profile and thus increase service life.

A thermally less stressable layer can be deposited over the blade tip coating, for example to increase the wear resistance of the entire blade tip coating in the initial run-in process.

The invention will now be explained in detail using an example and with the help of the figures.

Figure 1:
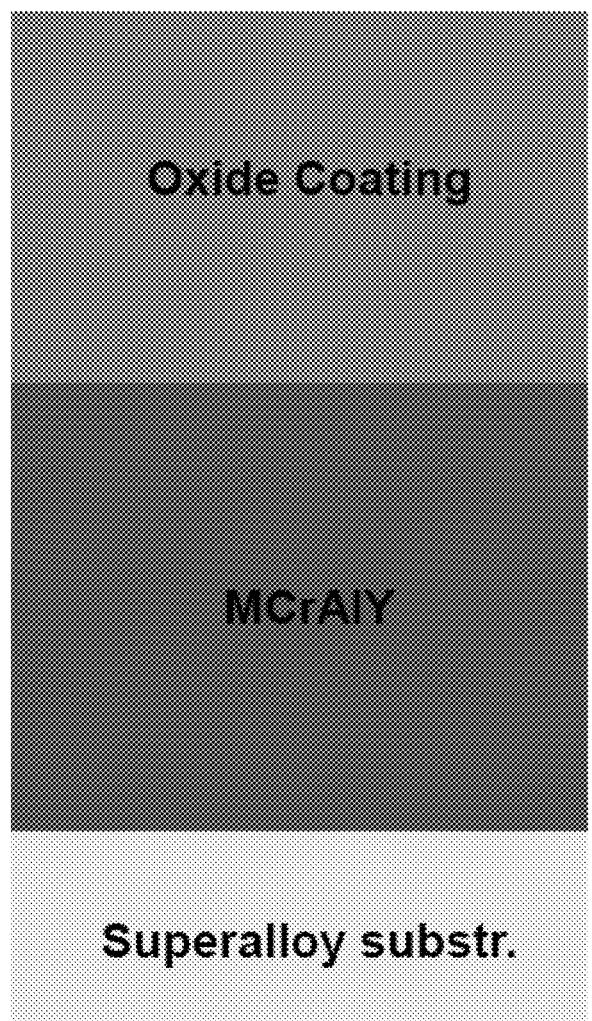
FIG. 1 shows schematically a layer system according to the invention made up of an MCrAlY layer and an overlying oxide layer.
Figure 2:
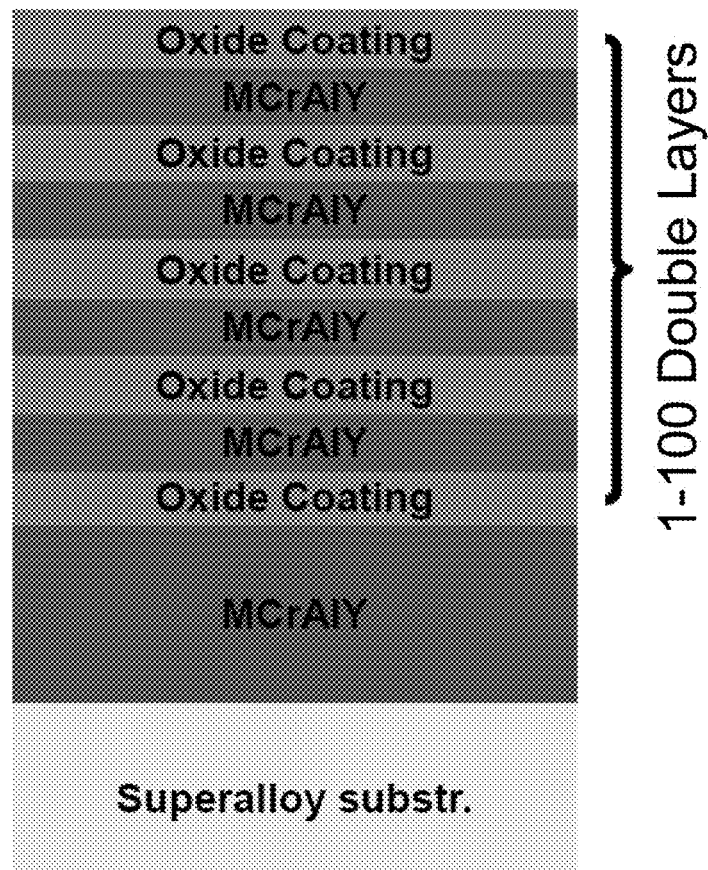
FIG. 2 shows schematically a multilayer coating system according to the invention.
Figure 3:
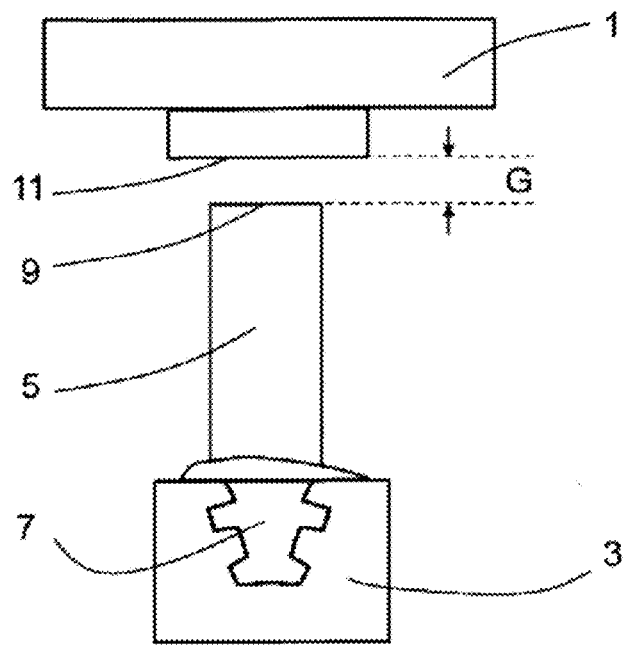
FIG. 3 shows the schematic representation of a turbine.

The turbine shown in FIG. 3 has at least one turbine blade 5 on a rotating disc 3 with a blade base 7 and a blade tip 9. FIG. 3 also shows a run-in layer 11 on a turbine liner 1 opposite the blade tip 9 and separated from it by a gap G.

On a blade tip made of a superalloy (may for example be single crystal) a coating of the composition MCrAlY—aluminum chromium oxide, or a multilayer coating of alternating layers of MCrAlY—aluminum chromium oxide is deposited.

The MCrAlY is deposited from a MCrAlY material source (=target) by plasma-enhanced cathodic spark evaporation. The MCrAlY layer can have thicknesses of 0.1-100 micrometers according to the required oxidation resistance.

The oxide layer is now deposited on the MCrAlY adhesion and anti-oxidation layer. The aluminum chromium oxide layers are deposited from metallic AlCr Targets by means of reactive cathodic spark evaporation in an oxygen atmosphere. The oxide layer can have a thickness of 0.5 to 50 microns.

In order to suppress harmful diffusion processes and thus increase the service life, the oxide layer can also be deposited as a multi-layer coating in which the MCrAlY layer alternates with an aluminum-chromium oxide layer at regular or other intervals of 0.1-20 micrometers.

In this concept, the oxide coating provides a diffusion barrier, which simultaneously also serves as an abrasive phase that is not sensitive to oxidation. The MCrAlY layer adhering directly to the substrate also provides excellent adhesion to the blade tip and the sum of all MCrAlY layers in the entire blade tip coating prevent inwardly oriented diffusion processes and efficiently protect the substrate from oxidation.

Figure 4:
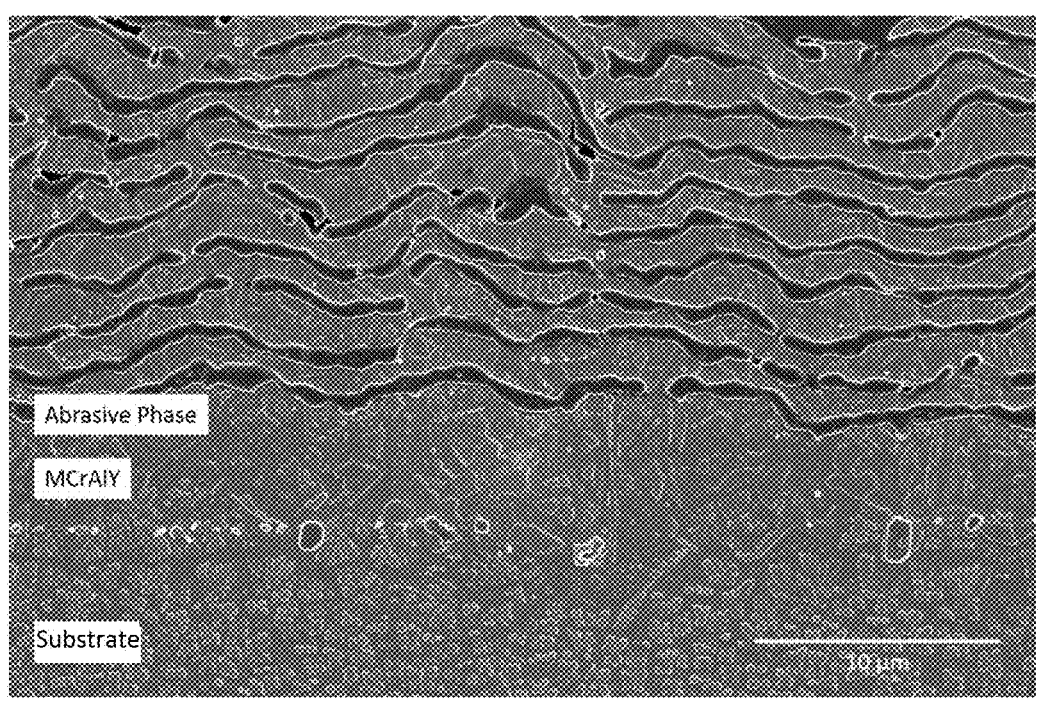
FIG. 4 shows a SEM of the cross-section of a multilayer coating system according to the invention after it had been exposed to a temperature of 1200° C. for 10 hours.

In very general terms, it can be said that the hardness of the overall layer system according to the invention can be adjusted by the ratio of abrasive phase to MCrAlY in order to enable optimal removal of the run-in layer. For example, layers with oxide phases in the range of 7 to 25 GPa can be adjusted. However, if harder abrasive phases such as nitrides, borides or carbides are used, the hardness can be increased up to 45 GPa. For example, the layer in FIG. 4 has a hardness of approx. 13 GPa.

Figure 5:
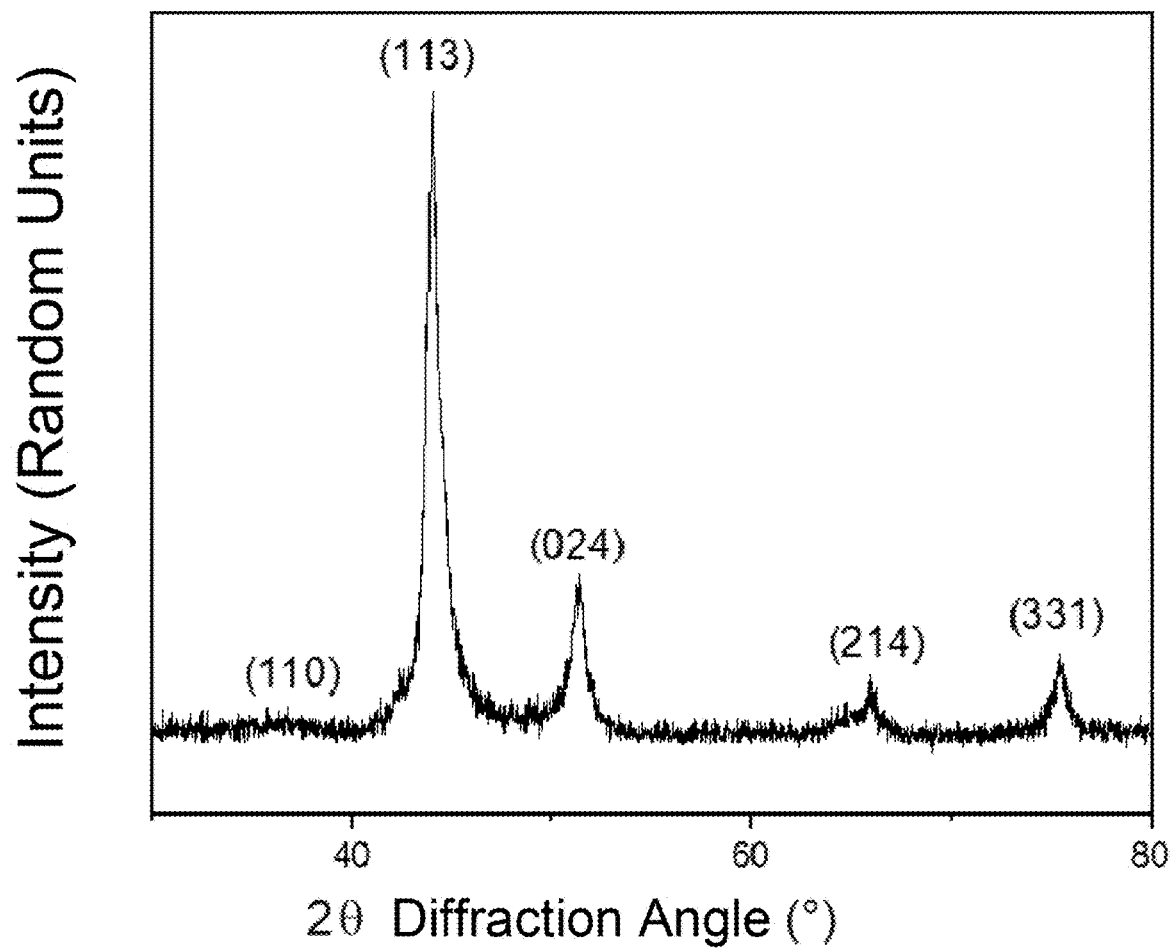
FIG. 5 shows the X-ray diffractogram of an abrasive phase of an aluminum oxide-chromium oxide.

If aluminum oxide-chromium oxide is used as the abrasive phase, it forms in the cathodic spark evaporation a mixed crystal in the corundum structure with a strong preferred orientation, as can be seen in FIG. 5. In the corundum structure, the mixed oxide is in its thermally stable high-temperature modification and can therefore reach the high application temperatures without phase transformation. The volume changes associated with the phase transformation, which can lead to the failure of the layer, can thus be prevented.

What is claimed is:

1. A method for coating a substrate comprising a gas turbine blade, comprising the steps:
   in a first step, application of a MCrAlY matrix by means of a PVD method, wherein "M" in MCrAlY stands for Co, Ni, or Co—Ni; and
   in a further step, application of a layer by means of a PVD method, wherein the layer is aluminum-chromium oxide,
   wherein the steps for applying the MCrAlY matrix and for applying the aluminum-chromium oxide are repeated alternately in order to deposit a multilayer layer comprising alternating MCrAlY and aluminum-chromium oxide layers.

2. The method according to claim 1, wherein the PVD method of the first and/or of the further step is a cathodic spark evaporation method.

3. The method according to claim 1, wherein the material source for the PVD method of the further step is an AlCr target and the coating method is a reactive method in the course of which oxygen is used.

4. The method according to claim 1, wherein the coating is executed as a layer system which comprises two layers or that the coating is executed as a layer system which comprises a multi-layer alternating coating system.

5. A layer system for a gas turbine blade tip, comprising:
   at least a first layer with a MCrAlY matrix, wherein "M" in MCrAlY stands for Co, Ni, or Co—Ni; and
   at least a second layer, wherein the second layer is aluminum-chromium oxide,
   wherein the layer system is a multi-layer coating system in which the first and second layer alternate.

6. A gas turbine blade with a coating system according to claim 5.

* * * * *